United States Patent [19]

Dessalles-Martin et al.

[11] Patent Number: 5,029,287
[45] Date of Patent: Jul. 2, 1991

[54] INSTALLATION FOR NUCLEAR MAGNETIC RESONANCE IMAGING

[75] Inventors: Diane Dessalles-Martin, Clamart; Guy Aubert, Grenoble; Martine Collet, Boulogne, all of France

[73] Assignee: General Electric CGR SA, Issy les Moulineaux, France

[21] Appl. No.: 368,350

[22] PCT Filed: Nov. 13, 1987

[86] PCT No.: PCT/FR87/00449
§ 371 Date: Jun. 15, 1989
§ 102(e) Date: Jun. 15, 1989

[87] PCT Pub. No.: WO88/03646
PCT Pub. Date: May 19, 1988

[30] Foreign Application Priority Data

Nov. 14, 1986 [FR] France ................. 86 15867

[51] Int. Cl.$^5$ ........................... G01R 33/20
[52] U.S. Cl. ...................... 324/318; 324/322
[58] Field of Search ............ 324/225, 300-322, 324/121; 315/8, 85; 313/402; 333/12; 307/91; 174/35

[56] References Cited

U.S. PATENT DOCUMENTS

| | | | |
|---|---|---|---|
| 3,389,333 | 6/1968 | Wolff et al. | 324/225 |
| 4,274,031 | 6/1981 | Saito | 315/8 |
| 4,490,675 | 12/1984 | Knuettel | 324/318 |
| 4,564,812 | 1/1986 | Dijk | 324/318 |
| 4,585,994 | 4/1986 | Ewing | 324/318 |
| 4,587,504 | 5/1986 | Brown | 335/216 |
| 4,595,899 | 6/1986 | Smith | 335/216 |
| 4,613,820 | 9/1986 | Edelstein | 324/318 |
| 4,724,412 | 2/1988 | Kalafala | 324/320 |
| 4,864,192 | 9/1989 | Buchwald | 315/8 |
| 4,926,289 | 5/1990 | Reichert | 324/319 |

FOREIGN PATENT DOCUMENTS

| | | |
|---|---|---|
| 0039502 | 11/1981 | European Pat. Off. . |
| 0167243 | 1/1986 | European Pat. Off. . |
| 2146071 | 3/1973 | Fed. Rep. of Germany . |

OTHER PUBLICATIONS

Electromedica, vol. 51, No. 2, 1983, H. Morneburg: "Gesichtspunkte bei der Standortsuche und Planung fur ein Magnetom", pp. 65-72.
Technology of Nuclear Magnetic Resonance, 14th Annular Symposium on the Sharing of Computer Programs and Technology, Feb. 5-6 1984, Orlando, U.S., The Society of Nuclear Medicine Ind. S. G. Einstein et al.: "Installation of High-Field NMR Systems into Existing Clinical Facilities: Special Considerations":, pp. 217-231.

Primary Examiner—Michael J. Tokar
Attorney, Agent, or Firm—Oblon, Spirak, McClelland, Maier & Neustadt

[57] ABSTRACT

In a nuclear magnetic resonance imaging installation, monitors of the cathode tube type are shielded from the effect of an intense magnetic field. For this purpose, the installation according to the invention has a flat coil which creates a second magnetic field, the direction of which is opposite to that of the intense magnetic field.

9 Claims, 2 Drawing Sheets

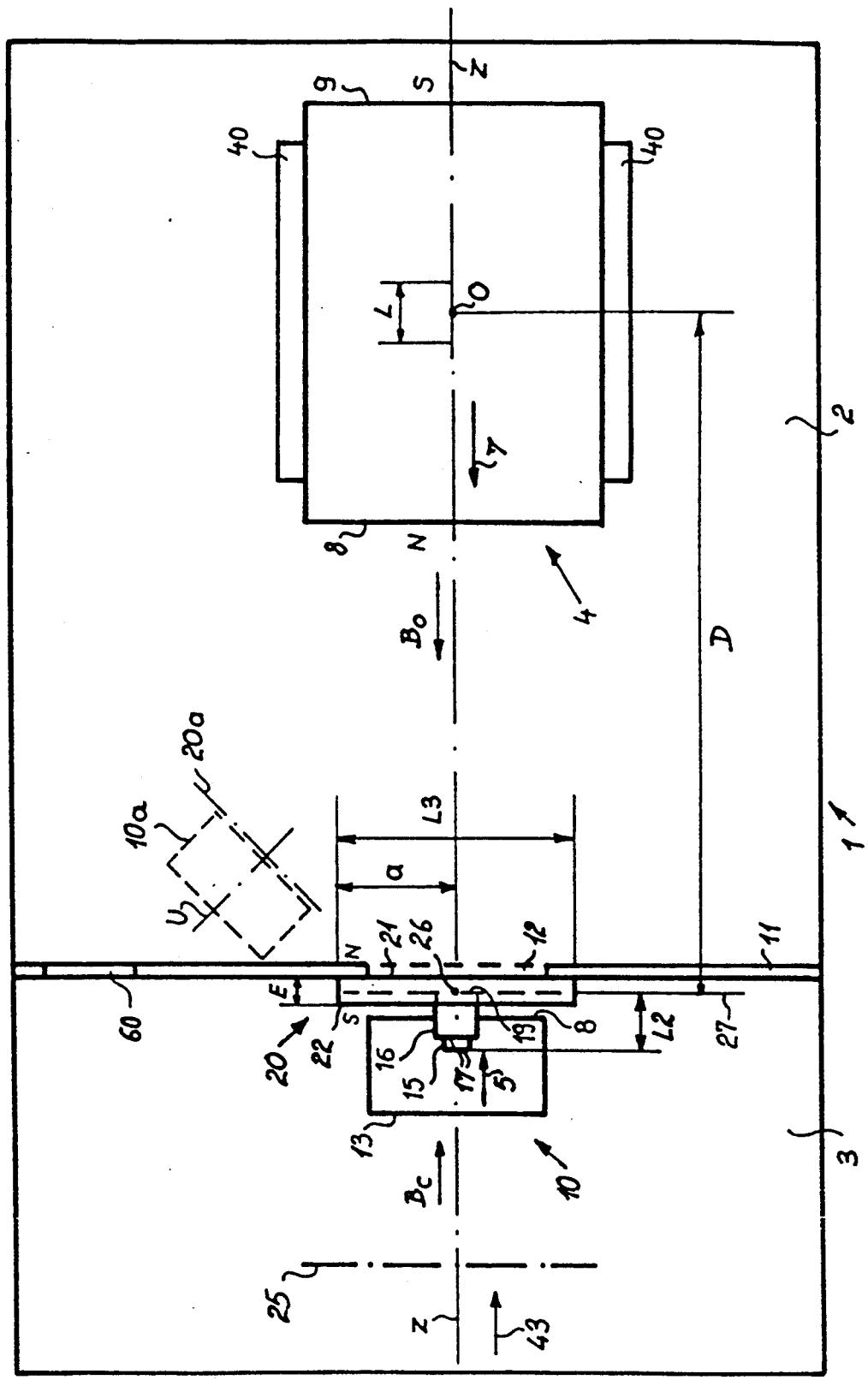

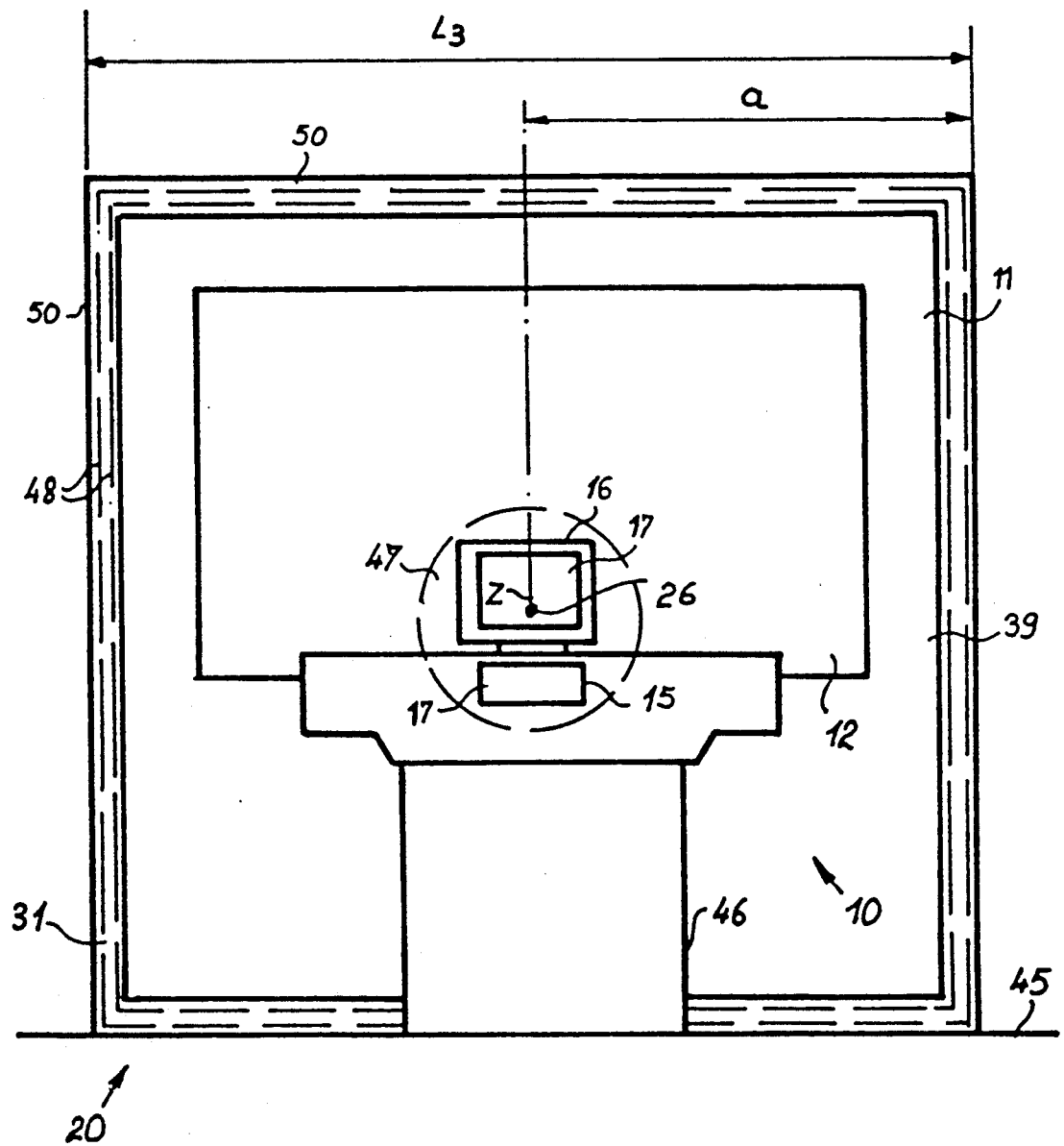
FIG_2

INSTALLATION FOR NUCLEAR MAGNETIC RESONANCE IMAGING

BACKGROUND OF THE INVENTION

1. Field of the Invention

The present invention pertains to an installation for imaging by nuclear magnetic resonance. The invention pertains especially to means which are used to shield instruments placed in the environment of the device that produces a magnetic field from the effect of the said magnetic field. This is the case, especially, for cathode screen type monitors used in the operating consoles of devices for imaging by nuclear magnetic resonance.

2. Description of the Prior Art

A nuclear magnetic resonance imaging device or an NMR device especially comprises a magnet which produces an intense, constant magnetic field in the device to which the body of a patient to be examined is subjected. Such a device is for example depicted in ELECTROMEDICA, volume 51, n°2, 1983, M. MORNEBURG: "GESICHTSPUNKTE BEI DER STANDORT SUCHE FUR EIN MAGNETOM", page 67-72.

The NMR device is put into operation by an operator or operators who act at an operating console to define the various parameters and control the various operations needed to obtain the desired image. For this purpose, an operating console generally has two monitors: a first monitor called an image monitor designed to display the image obtained and a second monitor called a dialogue monitor which, in particular, enables an operator to adjust the different parameters. The use of the dialogue monitor is made much easier when it is placed beneath a tactile screen. But it must be noted that the use of a tactile screen is not really worthwhile unless the dialogue monitor is itself a color monitor.

In general, the MRI device itself is placed in a first room which forms a Faraday cage. The operating console is placed in an adjoining room, and the wall between the two rooms has a glass window so that the operators or doctors do not lose sight of the patient throughout the time when he is placed in the MRI device, so that they can quickly be at his side if there is any hitch. For this reason, and also to reduce the area of the premises needed, it is sought to place the operating console at a relatively small distance from the MRI device, for example, at less than 10 meters.

The problem that arises here relates to the use of the the monitors when they are subjected to the magnetic field produced by the MRI device.

For, when a monitor is set up in a magnetic field, it undergoes disturbances which make it unusable. For example, with a black-and-white monitor placed in a three-Gauss magnetic field, it is impossible to use a tactile screen properly. With a color screen, the constraint is even greater and the color screen is practically unusable when it is in a field of more than than 0.5 gauss.

The intense field produced by the MRI instrument can reach several thousands of Gauss in the instrument itself, so that in the control next to the examination room, the leakage field of the magnet, even at 10 meters, is still far greater than the values referred to above. Consequently, it is noted that in the prior art, only black-and-white monitors can be used with the operating console at less than 10 meters from the MRI instrument, even then provided that these monitors are contained in boxes forming shields. The use of a shield placed, for example, around a monitor, not only makes it impossible to use a color monitor at less than 10 meters from the NMR device but also has the disadvantage of requiring a setting of the black-and-white instruments. For despite the use of shielding, this residual spurious field makes it necessary to adjust the deflection coils proper to the monitor in order to make it usable. This disadvantage is a particularly big one because the adjustment cannot be done unless the black-and-white monitor is taken out of its shield and the result of the adjustment is not visible unless the monitor is again reintroduced into its shielding box. Thus, several successive adjusting operations are needed before the optimum setting is obtained.

It is known by the EP-A No. 0 039 502 application a device for correcting the field effects on color monitor. Meanwhile this device when it is set lead to the unsettlement of a similar device placed on a neighbouring monitor. As a result the entire correction is long to be achieved for the two monitors.

3. Summary of the Invention

A particular object of the present invention is to enable to the use of at least one black-and-white or color monitor in a nuclear magnetic resonance imaging insulation at a distance from the device which is far smaller than in the prior art for the same field intensity, and to enable the use of the monitor or monitors in a far simpler and surer way than in the prior art. It must be observed that, in substantially the same conditions, the invention can be applied to the shielding of other instruments from the magnetic field, for example, magnetic tapes for which the use and storage near an MRI device may raise problems.

According to the invention, a nuclear magnetic resonance imaging installation comprises a device to produce an intense magnetic field, the said device being at a given distance from at least one instrument the operation of which may be disturbed by the intense magnetic field, the said installation comprising means to produce a second magnetic field in a direction substantially opposite to that of the intense magnetic field, so that the second magnetic field tends to cancel the first intense magnetic field at the level of the instrument.

BRIEF DESCRIPTION OF THE DRAWINGS

The invention will be better understood from the following description, given as a non-exhaustive example, with reference to the two appended figures, of which:

FIG. 1 is a schematic view of a nuclear magnetic resonance imaging installation according to the invention;

FIG. 2 is a frontal view of a flat coil and an operating console shown in FIG. 1.

DESCRIPTION OF A PREFERRED EMBODIMENT

FIG. 1 gives a schematic view of a nuclear magnetic resonance imaging installation 1 or an MRI installation designed, in the non-exhaustive example described, for diagnostic use in medecine. According to a standard type of layout in hospital locations, the MRI installation 1 is divided between two contiguous rooms, of which the first is an examination room 2 and the second is a monitoring room 3. The examination room 2 contains the MRI device 4 proper, symbolized in FIG. 1 by a rectangle set along a longitudinal axis Z. In practice, the MRI device 4 may have a generally circular cylindrical centered on the longitudinal axis Z, with its interior part along the longitudinal axis Z designed to take a patient (not shown). The MRI device 4 comprises, in a manner which is conventional in itself, a coil or a magnet (not shown) that produces an intense, homogeneous and constant magnetic field $B_O$ inside the MRI device 4, and especially in a volume under observation represented in FIG. 1 by a length under observation L having a center O. The direction of the field $B_O$ inside the MRI device 4 is, for example, the direction shown by the arrow 7, so that the MRI device 4 may symbolize a magnet with one side 8, towards the monitoring room 3, forming a northern side N and the second side 9, opposite to the examination room 3, forming a southern side S. The direction of the field $B_O$ is that of the longitudinal axis Z, and its intensity, which is constant at all points of the length under observation L, is several thousands of gauss along this length under observation L, for example, 5000 gauss or 0.5 tesla.

The monitoring room 3 contains an operating console 10 through which operators (not shown) conduct the operations needed to obtain the image of the patient. A partition 11, which separates the examination room 2 from the monitoring room 3, has a communicating door 60 and a window 12 through which the operators watch the patient throughout the examination. According to a preferred layout, when permitted by the shape of the available premises, the plane of the window 12 is substantially perpendicular to that of the longitudinal axis Z of the MRI device 4, and the operating console 10 is substantially parallel to the window 12. This arrangement enables operators at front 13 of the operating console 10 to handle the controls of the said operating console 10 without losing sight of the patient.

As mentioned above, an operating console 10 has at least one monitor. In the non-exhaustive example described, the operating console 10 has a first monitor and a second monitor 15, 16, set one on top of the other, so that the first monitor 15 which, in FIG. 1, is further in the background than the second monitor, is only partially shown. The screens 17 of the monitors 15, 16, are pointed substantially towards the front 13 of the operating console 10, and form a volume which is especially sensitive to the intense magnetic field $B_O$, this particularly sensitive volume being shown in FIG. 1 by a sensitive length L2 formed between the screen 17 and the rear 19 of the monitors 15, 16.

According to one characteristic of the invention, the MRI installation 1 has means to produce a second magnetic field $B_c$, which opposes the first field $B_O$. In the non-exhaustive example described, the means used to produce the second magnetic field $B_c$, which opposes the first magnetic field $B_O$, comprise a coil 20 of the flat coil type. The flat coil 20 has a current (not shown) flowing through it in a direction such that a first side 21 of the flat coil 20 pointed to the MRI device 4 constitutes a north pole N and its second side 22 constitutes a south pole S.

In the non-exhaustive example described, since the flat coil 20 is centered on the longitudinal axis Z, the second magnetic field $B_c$ is also pointed along the axis Z but its direction on the axis Z, shown by the second arrow 5, is opposite to the first direction 7 of the first field $B_O$. The result of this is that, when adjusting the intensity of the second field $B_c$, there is a tendency to compensate for and even to cancel the first field $B_O$, especially on the sensitive length L2.

It must be noted that, within the spirit of the invention, the second opposing magnetic field $B_c$ may also be produced in a different way, for example, by a coil or coils (not shown) set in the monitors 15, 16 themselves or, again, by a solenoid valve (not shown) of a great length which will be set around the monitors 15, 16 or even around the operating console 10. Among these various means, the flat coil 20 has a major advantage in that it occupies little space and, therefore, creates hardly any inconvenience. For the flat coil 20 may have a circular or square section, and its plane may be parallel to that of the window 12, and it may even be applied to this window 12 as in the non-exhaustive example shown in FIG. 1. This position of the flat coil 20 is especially advantageous in reducing the space occupied. However, the flat coil 20 may have a different position with respect to the monitors 15, 16: for example, it may surround the monitors 15, 16, or again, it may be set on the other side of these monitors from the MRI device 4.

In the non-exhaustive example described, the monitors 15, 16, are set along the longitudinal axis Z so that the second sensitive length L2 is identical with or substantially parallel to the longitudinal axis Z. The flat coil 20 is itself centered on the longitudinal axis Z and its plane is perpendicular to the latter. Thus, it is possible to virtually nullify the magnetic field along the sensitive length L2, so that black-and-white or color monitors 15, 16 can be used without its being necessary to place these monitors 15, 16 in a shielding box as in the prior art.

For, assuming that the intense field $B_O$ at the center O of the length under observation L has a value of about 5000 gauss, its value on the axis Z at a distance D of about 7 meters is about 10 gauss, i.e. the sensitive length L2 would be subjected to a magnetic field of 10 gauss in the absence of the flat coil 20, and this would make it impossible to use black-and-white type monitors 15, 16 without shielding and quite impossible to use color type monitors with or without shielding.

FIG. 2 shows a flat coil 20 and the operating console 10 seen from the front of the said console 10, as shown in FIG. 1 by a third arrow 43.

FIG. 2 shows in the operating console 10 in the foreground, then the flat coil 20 in the background and, finally, further still in the background, the partition wall 11 which has the window 12. The operating console 10 is raised above the floor 45 by a pedestal 46. The operating console 10 has various conventional control and display elements (not shown) and has the first and second monitors 15, 16. The first monitor 15 is the dialogue monitor which may comprise a tactile screen (not shown). The second monitor 16, placed above the first monitor, is the image monitor. In the MRI equipment of the invention, these two monitors 15, 16 may equally well be black-and-white or color type monitors. The entire surface 47, presented by the two monitors 15, 16, parallel to the plane of the flat coil 20, is substantially centered on the center 26 of the flat coil 20. In the non-exhaustive example described, the center 26 further represents the longitudinal axis Z of the MRI device 4 shown in FIG. 1.

The flat coil 20 is made of a conventional conductor forming turns 48 (depicted in broken lines) mounted on a frame 31 made of a non-magnetic material such as wood for example. In the non-exhaustive example described, the section 39 of the flat coil 20, given by the shape of the frame 31, is substantially square. The sides 50 of the frame have a third length L3 of about 2 meters in the non-exhaustive example described, so that the mean distance a between the center 26 of the flat coil 20 and its periphery represented by the frame 31 is about 1 meter, namely half the third length L3 of the sides 50.

Referring again to FIG. 1, the rear 8 of the desk 10 is preferably very close to the second side 22 of the flat coil 20, a few centimeters away, so that the rear of the monitors 15, 16 is also very close to it and may, if necessary, penetrate the flat coil 20 so that, for example, it is at the level of the median plane 27 of the said flat coil. The flat coil 20 has a thickness E of a few centimeters, for example 5 centimeters. Since the monitors 15, 16, are generally always in the same position in operating consoles such as the operating console 10, the said operating console 10 and the flat coil 20 form a set which may be positioned, with respect to the MRI device 4, differently to the arrangement shown in FIG. 1, so that, for example, it fits the requirements of existing sites. Thus, for example, the set formed by the flat coil 20 and the operating console 10 may be moved sideways along an axis 25, crossing the longitudinal axis Z, so that it is suited to hospital configurations where the operating console 10 cannot be placed facing the magnet or MRI device 4. However, this moving can be done within relatively small limits of about 0.6 meters on either side of the longitudinal axis Z.

Nevertheless, the set formed by the flat coil 20 and the operating console 10 can be moved to a far greater extent with respect to the longitudinal axis Z, provided that this set is pointed in such a way that the plane of the flat coil 20 is substantially perpendicular to the local direction of the magnetic field. This arrangement is shown in FIG. 1 where the operating console 10 and the flat coil 20 are shown in dashes and are respectively marked 10a and 20a, the flat coil 20a being perpendicular to a second local direction U of the intense magnetic field $B_O$.

In all cases, the value of the second magnetic field $B_c$ can be adjusted to compensate for or even cancel the intense magnetic field $B_O$ on the sensitive length L2, by adjusting the value of the current which flows in the conductors (not shown) of the flat coil 20. This flat coil 20 is supplied by an adjustable supply which is itself conventional (not shown).

According to one characteristic of the invention, the mean distance a between the center 26 and the frame 31 is equal to or greater than the sensitive length L2 presented by the monitors 15, 16, so that the value of the second field $B_c$ set up by the flat coil 20 undergoes relatively little variation on its axis. Furthermore, it must be noted that, by placing the flat coil 20 between the MRI device 4 and the monitors 15, 16, the reduction, if any, in the value of the second magnetic field $B_c$ along the sensitive length L2 is substantially compensated for by the reduction in the value of the intense field $B_O$ in the direction of the axis Z as the distance from the MRI device increases. For it is noted that, on the longitudinal axis Z, at a distance D of about 5.5 m. from the center O of the MRI device 4, the intense field $B_O$ has a value of 18 gauss while, at 5.8 meters, the intense field $B_O$ has a value of about 15 gauss. Consequently, by placing the monitors 15, 16, so that the sensitive length L2 is substantially opposite to the MRI device 4 with respect to the median plane 26 of the flat coil 20, it is possible, with a flat coil 20 having a radius or mean distance a equal to or greater than the sensitive length L2, not only to obtain a situation where the opposing second field $B_c$ varies to a fairly small extent, but also to obtain compensation for this variation by the variation of the first intense magnetic field $B_O$.

It must be noted that, to a specialist in nuclear magnetic resonance imaging, the method of the invention used to solve the problem of using monitors subjected to intense magnetic fields may cause surprise and even disquiet because, to such a specialist, any magnetic field produced in the environment of an MRI device could be superimposed on the intense field $B_O$ and could destroy its homogeneity on the first length under observation L.

However, computations have foreseen and tests have shown that the second compensation field $B_c$ produced by the flat coil 20 at a relatively small distance D from the center O of the MRI device 4 gives only a small modification to the value of the intense field $B_O$ along the length under observation L, and this modification in value causes only a small displacement, during operation, of the central section with respect to the original position, namely with respect to the center O. This modification of the value of the field $B_O$ is eliminated during the calibrating operation which is conventional for an MRI device and which makes it possible to redefine the position of the central section with respect to the original position. For, if it is assumed that the distance D is 6.8 meters between the flat coil 20 and the center O of the length under observation L, and that the flat coil 20 has the following characteristics given purely by way of example:

The frame 31 is a square the sides 50 of which have a length L3 equal to 2a equal to 2 meters, giving a square of 2×2 m.;

The coil 20 has 100 turns through which flows a current of 16.5 amperes, giving 1650 amperes which make it possible to obtain the value of the second field $B_c$ needed to compensate for the intense field $B_O$ along the sensitive length L2; the flat coil 20 is centered on the axis Z, i.e. it is practically coaxial with the MRI device 4;

then the field $B_c$ produced by the coil 20 on its axis Z at a distance D is given by the following formula:

$$B = \frac{2\mu_0 I}{\pi} \cdot \frac{a^2}{(a^2 + D^2) \cdot (2a^2 + D^2)^{\frac{1}{2}}}$$

where $\mu_0$ is the permeability of the vacuum $= 4\pi \times 10^{-7}$; I is the current in the coil 20; a is the mean distance between the center 26 of the coil and the frame 31; D is the distance from the center 26 to the flat coil 20.

It is found that for a distance D=0, namely at the center 26 of the coil 20, the field $B_c$ is equal 9.3 gauss.

It is found that for a distance D=6.8 meters, i.e. at the center O of the length under observation L, the value of the second compensation field $B_c$ is 0.04 gauss, which may have to be compensated for by the calibration of the MRI device 4 as explained above. With respect to any major fault in the homogeneity of the field $B_O$ measured, for example, along the longitudinal axis Z, which may be given by the second compensation field $B_c$, its value is given by the derivative of the second field $B_c$ on the axis Z, determined by the second formula below:

$$\frac{dB_c}{dD} = \frac{2\mu_0 I}{\pi} \cdot \frac{a^2 \cdot D(5a^2 + 3D^2)}{(a^2 + D^2)^2 \cdot (2a^2 + D^2)^{3/2}} \cdot T/m$$

where $\mu_0 = 4\pi \cdot 10^{-7}$; $I = 1650$ amperes; a is the mean distance equal to 1; D is equal to 6.8 meters and corresponds to the distance between the center of the flat coil and the center of the length under observation L; Tm = tesla per meter.

We get $dBc/dB = 17.10^{-7}$ T/m: this result shows that the field variation on one meter at the center O of the MRI device 4 is 0.017 gauss so that the field gradient provided by the axis Z is smaller than one part per million or one p.p.m. in a standard MRI device: it is hence smaller than the limit of measurability, and may therefore be neglected.

If the flat coil 20 is even closer to the center O of the MRI device 4, the field gradient or non-homogeneity given to the second field $B_c$ on the length under observation L may be greater than 1 p.p.m. In this case, this non-homogeneity can be easily compensated for by adjusting the offset current of a gradient coil.

For it is known that MRI devices conventionally comprise, in addition to a coil producing the intense field $B_O$, gradient coils with the function of creating a field gradient along three orthogonal axes, one of which is the longitudinal axis Z. These gradient coils are generally mounted in a known way around the cylinder formed by the MRI device. Only one gradient coil 40, designed to act along the longitudinal axis Z, is represented in FIG. 1 for the greater clarity of this figure.

Field gradients are established only during an examination stage, so that they are established according to a pulse. By continuously applying a current, called an offset current, to one or more of these gradient coils in a known way, the said offset current being capable of having pulses superimposed on it, first order inhomogeneite of the intense field $B_O$ can be corrected by appropriately adjusting this current so that each of the gradient coils may constitute a means to compensate for a non-homogeneity of the field $B_O$ created in the MRI device 4 by the flat coil 20. Thus, returning to the non-exhaustive example described, where the flat coil 20 is perpendicular to the longitudinal axis Z and centered on the said axis Z, it is possible to use the gradient coil 40 and apply an offset current to it, making it possible to correct the first order homogeneity faults of the field $B_O$ along the axis Z, including the faults created by the functioning of the flat coil 20.

This description is a non-exhaustive example showing how instruments can be shielded from the effect of an intense magnetic field, especially instruments of the type comprising a cathode tube. The invention is especially valuable for MRI diagnostic installations, but can also be applied for the shielding of instruments in all installations using intense magnetic fields.

What is claimed is:

1. A nuclear magnetic resonance imaging installation comprising a device to produce an intense magnetic field, the said device being placed at a given distance from at least one cathode tube monitor to be shielded from the intense magnetic field, the said magnetic field having a first direction at the place of said monitor, the said installation comprising a flat coil to produce a second magnetic field having a second direction substantially opposite to the direction of said first intense magnetic field, so as to tend to cancel a leakage magnetic field produced by the intense magnetic field, at the place of said monitor.

2. An installation according to the claim 1 wherein the monitor is of the color monitor type.

3. An installation according to any of the claims 1 or 2 wherein, the monitor has a length sensitive to the magnetic field, the flat coil has a mean distance between its center and a peripheral part of this flat coil, and this mean distance is equal to or greater than the said sensitive length.

4. An installation according to any of the claims 1 or 2 wherein the plane of the flat coil is substantially perpendicular to a direction of the intense magnetic field at the place of said monitor.

5. An installation according to any of the claims 1 or 2 wherein the monitor is substantially centered on an axis of the flat coil said axis of said flat coil being an axis perpendicular to the plane of said flat coil at the center of said flat coil.

6. An installation according to the claim 3 wherein the flat coil is placed substantially between the device and the monitor at a distance approximately egal to the sensitive length.

7. An installation according to any of the claims 1 or 2 wherein the flat coil has substantially square section.

8. An installation according to the claim 4 wherein a first direction of the intense magnetic field is identical with the longitudinal axis of the device and wherein the center of the flat coil is substantially placed on the said longitudinal axis.

9. An installation according to any of the claims 1 or 2 further comprising means to compensate for a non-homogeneity of the intense field created in the device by the second magnetic field.

* * * * *